United States Patent [19]

Akiyama et al.

[11] Patent Number: 4,788,577
[45] Date of Patent: Nov. 29, 1988

[54] SUBSTRATE SURFACE DEFLECTING DEVICE

[75] Inventors: Nobuyuki Akiyama, Yokohama; Asahiro Kuni, Tokyo; Yukio Kembo; Toshihiko Nakata, both of Yokohama, all of Japan

[73] Assignee: Hitachi, Ltd., Tokyo, Japan

[21] Appl. No.: 142,698

[22] Filed: Jan. 11, 1988

[30] Foreign Application Priority Data

Jan. 12, 1987 [JP] Japan .................................. 62-3179

[51] Int. Cl.$^4$ .............................................. G03B 27/42
[52] U.S. Cl. ........................................ 355/53; 355/73
[58] Field of Search .............................. 355/53, 73, 76

[56] References Cited

U.S. PATENT DOCUMENTS

| | | | |
|---|---|---|---|
| 3,569,718 | 3/1971 | Borner | 355/53 |
| 4,084,903 | 4/1978 | Pircher | 355/53 |
| 4,140,392 | 2/1979 | Lacombat et al. | 355/53 |
| 4,155,642 | 5/1979 | Lacombat | 355/53 |
| 4,172,656 | 10/1979 | Lacombat et al. | 355/53 |
| 4,298,273 | 11/1981 | Nishizuka et al. | 355/53 |
| 4,391,511 | 7/1983 | Akiyama et al. | |
| 4,475,223 | 10/1984 | Taniguchi et al. | |
| 4,504,045 | 3/1985 | Kenbo et al. | |
| 4,564,284 | 1/1986 | Tsutsui | 355/53 |
| 4,666,291 | 5/1987 | Taniguchi et al. | |
| 4,737,824 | 4/1988 | Sakai et al. | 355/53 |

Primary Examiner—Monroe H. Hayes
Attorney, Agent, or Firm—Fay, Sharpe, Beall, Fagan, Minnich & McKee

[57] ABSTRACT

An exposure apparatus comprises a stage; a base plate provided on the stage; a flexible chuck plate which is capable of sucking under vacuum a substantially entire surface of a substrate to a surface thereof; a plurality of vertical displacement generating mechanism including a plurality of feedscrews provided at the base plate with predetermined intervals therebetween, a plurality of rotational actuators for rotatively driving each of the feedscrews, and a plurality of spring members interposed between the chuck plate and the base plate so as to allow a tip of each of the feedscrews to be engaged with a rear surface of the chuck plate; restricting mechanism for restricting the chuck plate in such a manner as not to be displaced horizontally relative to the base plate; a mask holder for holding a mask; a mechanism for measuring a level of the mask held by the mask holder; and a mechanism for measuring a level of the substrate sucked onto the chuck plate, whereby each of the rotational actuators of the vertical displacement generating mechanism is driven on the basis of gaps between the mask and the substrated measured by the mechanism for measuring the level of the mask and the mechanism for measuring the level of the substrate so as to subject the substrate to deflection via the flexible chuck plate, thereby producing a uniform gap between the mask and the substrate.

4 Claims, 5 Drawing Sheets

F I G. 6
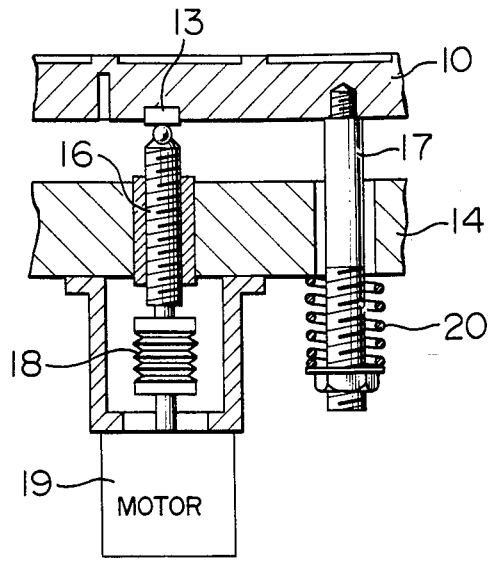
F I G. 7A
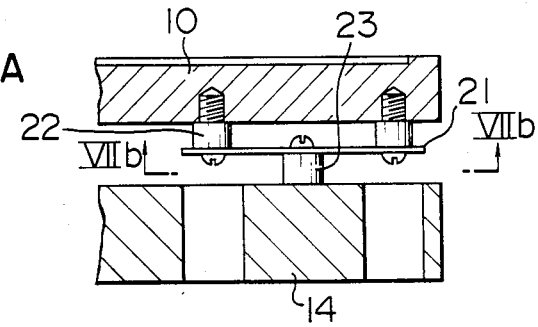
F I G. 7B
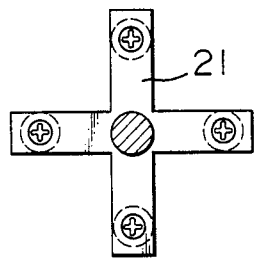

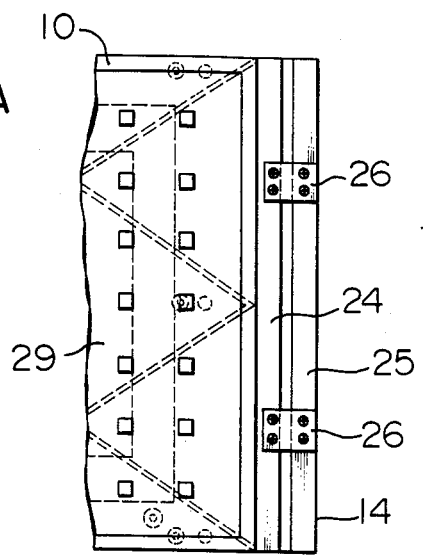
FIG. 8A
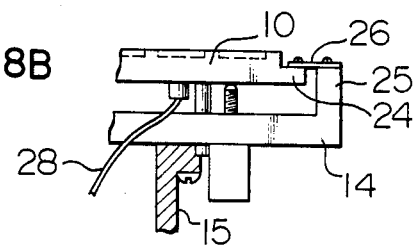
FIG. 8B
FIG. 9A
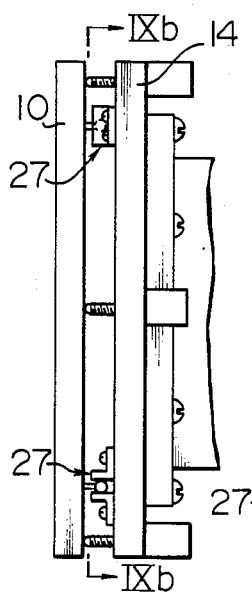
FIG. 9B
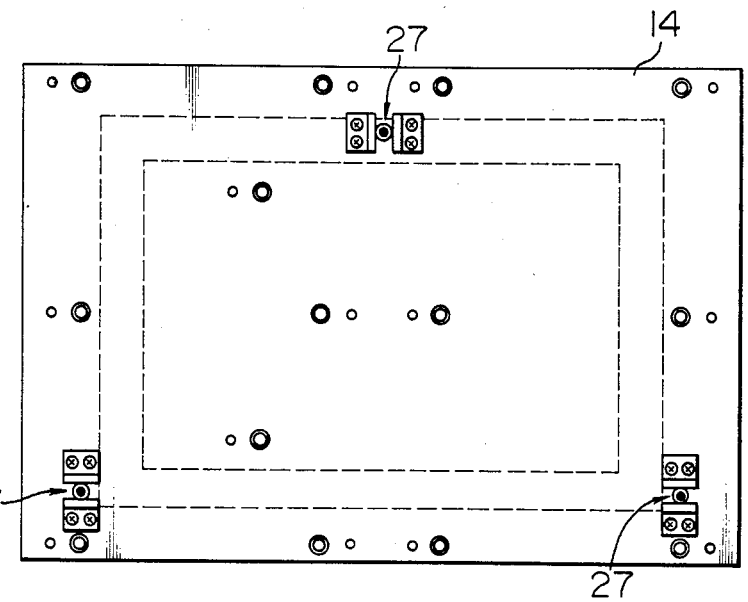

SUBSTRATE SURFACE DEFLECTING DEVICE

BACKGROUND OF THE INVENTION

1. Field of the Invention

The present invention relates to a substrate surface deflecting device for use in an apparatus such as an exposure apparatus suitable for exposing a printed circuit board, a plate of a liquid crystal display element, and the like to irradiation such as light for producing thereon patterns with a large area.

2. Statement of the Related Art

As disclosed in Japanese Patent Unexamined Publication Nos. 56-130738 (U.S. Pat. No. 4,391,511), 58-67026 (U.S. Pat. No. 4,504,045), 57-204547 (U.S. Pat. No. 4,475,223), and 61-239638 (U.S. Pat. No. 4,666,291), conventional exposure apparatuses employ piezoelectric elements as vertical displacement driving sources. The arrangement of these exposure apparatuses is such that a chuck and the piezoelectric elements are not fixed to each other but held in contact with each other, a chamber below the chuck is evacuated, and the chuck is thereby pulled downwardly to be pressed against the piezoelectric elements, such that the surface of the substrate can be deformed or deflected by the piezoelectric elements.

An improvement of this method is disclosed in Japanese Patent Unexamined Publication No. 61-102735, in which the chuck of the substrate is moved vertically up and down by piezoelectric elements, but the lower side of the chuck is not held under vacuum, and the chuck and the piezoelectric elements are connected to each other by resilient supports.

In the above-described prior art, since the possible magnitude of displacement or stroke by the piezoelectric elements is small, this method is inadequate in deflecting substrates, such as printed circuit boards, which have a large warping or deflection. In addition, since a method of assembly is complicated, a large number of assembly processes are required. Furthermore, in the apparatus in which the chuck is pulled dowardly under vacuum, it is necessary to provide a substantially vacuum chamber on the lower side of the chuck. Therefore, there has been drawbacks in that a sealing mechanism becomes complicated, and that the overall size of the apparatus becomes large.

SUMMARY OF THE INVENTION

Accordingly, an object of the present invention is to provide a compact and easy-to-assemble substrate surface deflecting or deforming device which is capable of deflecting or deforming, as desired, a surface of a substrate having a large area whose warping or deflection is large or significant, thereby enabling to print a circuit pattern at a high resolution.

According to the present invention, the object can be attained by substrate surface deflecting device comprising: a base plate; a flexible chuck plate deformable at angular grooves formed regularly in a rear face thereof, the chuck plate being capable of sucking under vacuum a substantially entire surface of a substrate; expansion and/or contraction drive elements mounted regularly on the base plate; spring members arranged regularly so as to force output ends of the driving elements engaged with the rea face of the chuck plate; means for restricting or preventing lateral or horizontal displacement of the chuck plate relative to the base plate; and means for controlling the deflection of the surface of the substrate to a desired configuration through the chuck plate by driving the expansion and/or contraction drive elements in response to the condition of the surface of the substrate.

According to the present invention, in particular, the device for deflecting the surface of the substrate can be formed very simply even in case of applying to a substrate having a large surface area.

According to the present invention, there is also provided an exposure apparatus which includes a vertical displacement generating mechanism for deflecting a flexible chuck plate, sucking a substrate onto a front surface thereof, by engaging with a rear surface of the flexible chuck plate, the vertical displacement generating mechanism being constituted by feedscrews each connected to motors provided on a base plate and springs members each provided to allow the flexible chuck plate to be engaged with the feedscrews. In the exposure apparatus according to the invention, an arrangement is also provided so as to allow a peripheral portion of the chuck plate not to be offset or displaced in the horizontal direction, thereby keeping the substrate deflected in such a manner as to maintain a uniform gap between a mask and the substrate.

The spring members serve to pull the chuck plate downwardly such that predetermined parts or points of the flexible chuck plate can be pressed by the corresponding tips of feed screws projecting upwardly. In addition, since the feedscrews are used, the stroke of vertical displacement becomes long, so that adjustment can be facilitated remarkably.

Furthermore, since a means for restricting the chuck plate in such a manner a not to be displaced horizontally is provided, the horizontal offset or displacement of the chuck surface can be prevented substantially. Hence, it is possible to maintain a uniform gap between the mask and the substrate without needing to measure the gap repeatedly, because the relative horizontal displacement which may destroy the uniform gap can be prevented.

In particular, since peripheral portions of the mask are usually warped by a substantial amount (dozens of microns), it is necessary to have the peripheral portions of the chuck surface to be deflected, and it is also necessary to prevent a horizontal offset or displacement of the chuck surface after the peripheral portions thereof are thus deflected. The above-described action can be accomplished by providing an arrangement in which the surface of the flexible chuck and the base are connected by vertically deflectable leaf springs or vertically sliding mechanisms as the above-described restricting means.

BRIEF DESCRIPTION OF THE DRAWINGS

FIG. 6 is a cross-sectional view of a part of the substrate surface deflecting device;

FIG. 7A is a cross-sectional view of a cross-shaped leaf spring;

FIG. 7B is a view, partly in section, taken along the line VIIb—VIIb of FIG. 7A;

FIG. 8A is a partial top plan view of the apparatus according to another embodiment which is different from that shown in FIGS. 7A and 7B;

FIG. 8B is a partial front elevational view of the apparatus shown in FIG. 8A;

FIG. 9A is a partial side elevational view of the apparatus according to still another embodiment which is different from those shown in FIGS. 7A, 7B, 8A and 8B; and FIG. 9B is a view, partly in section, taken along the line IXb—IXb of FIG. 9A.

DETAILED DESCRIPTION OF THE PREFERRED EMBODIMENTS

Figure 1:
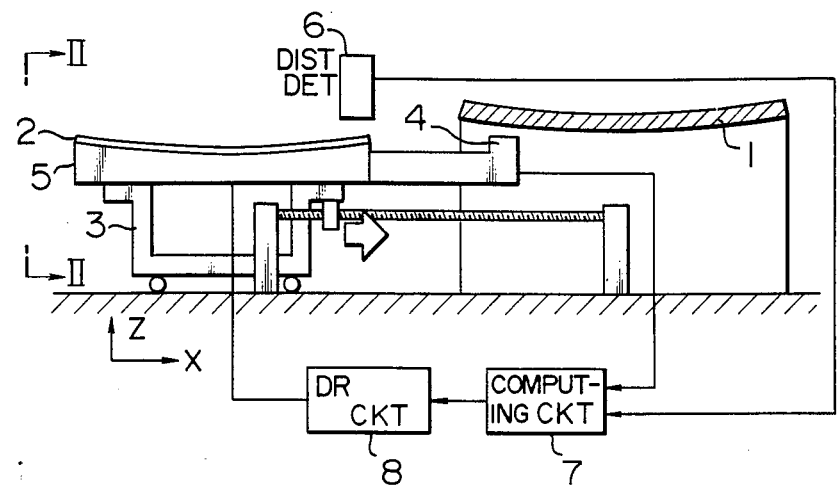
FIG. 1 is a schematic diagram illustrating an embodiment of an exposure apparatus in accordance with the present invention.

Referring now to FIG. 1, a description will be made of an embodiment of the present invention. After a mask 1 is set, air micrometers or pneumatic gauges 4 secured to a stage 3 are moved below the mask 1 rightwardly as viewed in FIG. 1, i.e., in the direction of the X-axis, and the deflection or waviness of the overall rear surface (pattern surface) of the mask 1 is measured by the pneumatic gauges 4. The measured data thus obtained is then stored in a memory (not shown). A substrate 2, such as a printed circuit board or a plate for a liquid crystal display element, is sucked onto a substrate surface deflecting device 5. The stage 3 is then moved rightwardly in the direction of the X-axis, and the deflection of a surface of the substrate 2 is measured by distance measurement sensors or distance detectors 6. The measured data thus obtained is stored in the memory. The measured data or signals obtained from the pneumatic gauges 4 and the distance measurement sensors 6 are calculated by a arithmetic or computing circuit 7, and the results thus obtained are sent to a drive circuit 8, which in turn drives motor (FIG. 5) of the substrate surface deflecting device 5, thereby allowing the deflection of the surface of the substrate 2 to conform with the deflection of the mask 1.

Figure 2:
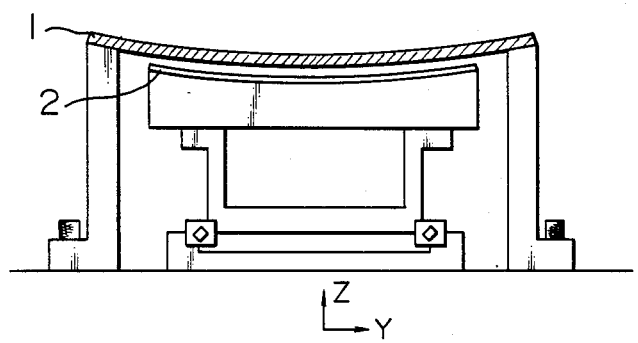
FIG. 2 is a side elevational view taken in the direction of the arrows II—II of FIG. 1.

Subsequently, the stage 3 is moved again rightwardly in the direction of the X-axis, and is stopped below the mask 1, which is shown in FIG. 2 illustrating a side elevational view taken in the direction of the arrows II of FIG. 1 in this state. Since the mask 1 and the substrate 2 have the same deflection, a gap between them is uniform over the entire surfaces thereof. Incidentally, the stage 3 has a Y-stage which moves in the direction of the Y-axis, a Z-stage which moves in the direction of the Z-axis, a rotational stage which rotates in a horizontal plane about a vertical axis, and a tilting mechanism which effects to position the substrate 2 in parallel with the mask 1. It is apparent that the Z-stage, the rotational stage, and the tilting mechanism may be provided on the mask side.

Figure 3:
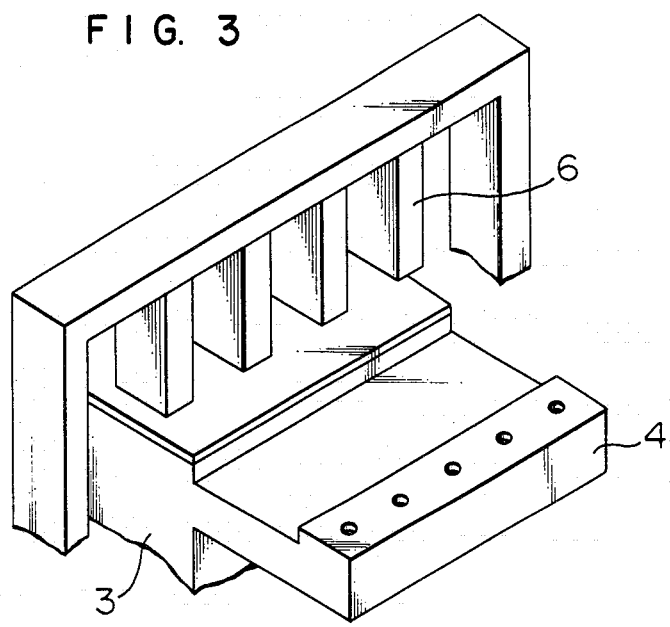
FIG. 3 is an explanatory perspective view of pneumatic gauges and measurement sensors shown in FIG. 1.

FIG. 3 shows an arrangement of the pneumatic gauges 4 and the distance measurement sensors 6. Both the pneumatic gauges 4 and the distance measurement sensors 6 are arranged laterally or horizontally, and the deflection of the overall surfaces of the mask 1 and the substrate 2 can be measured when the stage 3 is moved once in one direction.

Figure 5:
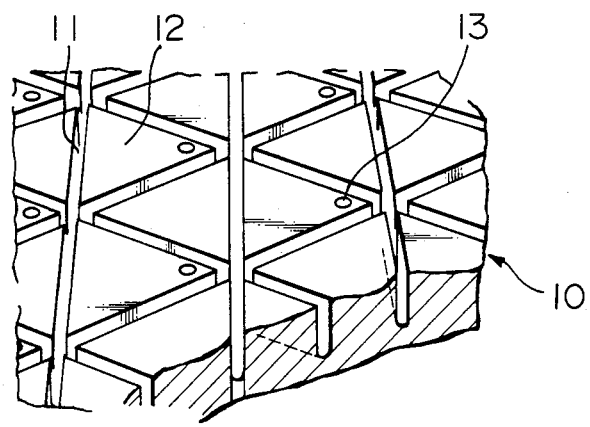
FIG. 5 is a partial perspective view, illustrating a rear or back side, of a flexible chuck shown in FIGS. 4A, 4B and 4C.
Figure 4A:
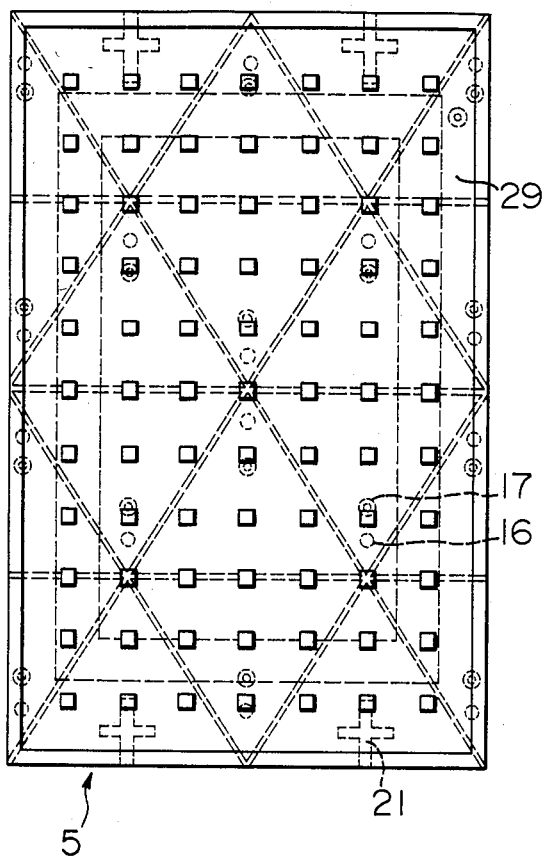
FIG. 4A is a top plan view of an example of a substrate surface deflecting device forming an important part in the apparatus of the invention.
Figure 4B:
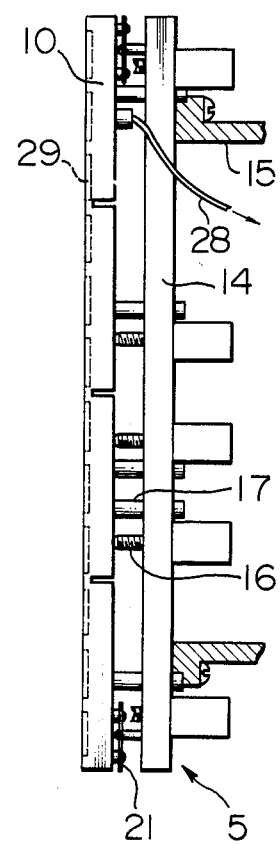
FIG. 4B is a front elevational view of the substrate surface deflecting device shown in FIG. 4A.
Figure 4C:
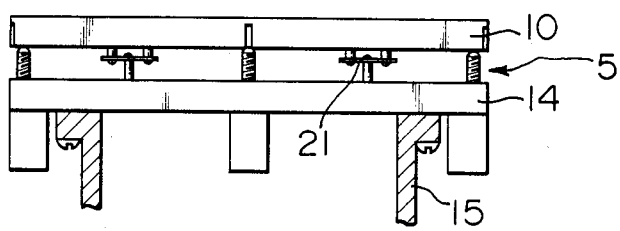
FIG. 4C is a side elevational view of the substrate surface deflecting device shown in FIG. 4A.

FIGS. 4A, 4B and 4C illustrate a structure of the substrate surface deflecting device 5. A flexible chuck 10 is a deflectable mask chuck and has on its surface grooves 29 connected to a vacuum source (not shown) by means of a pipe 28 in such a manner that the overall surface of the substrate 2 can be forced thereto under vacuum. As shown in FIG. 5, the flexible chuck 10 has grooves 11 on a rear surface thereof and the entire flexible chuck 10 is subjected to deflection or deformation at portions of the grooves such that each of triangular blocks 12 is displaced as a unit. A part 13 indicated by a small circle corresponds to a point where a column screw, which will be described below, comes into contact.

Disposed below this flexible chuck 10 are a base plate 14 and columns 15 provided on the stage 3 so as to support the base plate 14. Disposed in or through the base plate 14 are column screws 16, each corresponding to each triangular block 12, for supporting the flexible chuck 10, and spring-loaded bars 17 for pulling or biasing downwardly the flexible chuck 10.

In FIG. 6, each of the column screws 16 meshes with an internal thread formed in the base plate 14, is rotated by means of a motor 19 via a flexible coupling 18 to effect a vertical movement, thereby displacing the point 13 vertically. Meanwhile, the spring-loaded bar 17 is pulled downwardly by means of a compression spring 20 to apply a downward force to the flexible chuck 10, thereby allowing the column screw 16 to be brought into intimate contact with the point 13.

FIGS. 7A and 7B are cross-sectional views of the cross-shaped leaf spring 21 shown in FIGS. 4A, 4B and 4C. In the drawings, the flexible chuck 10 is allowed to be displaced vertically with respect to the principal plane of the base plate 14, but must not be displaced horizontally or parallely thereto. For this reason, four cross-shaped leaf springs 21 are provided in longitudinally opposite peripheral end portions of the flexible chuck 10. Each bar 22 is firmly fixed to the flexible chuck 10, while each pad 23 is firmly fixed to the base plate 14. Since the flexible chuck 10 and the base plate 14 are connected to each other by means of the cross-shaped leaf springs 21 through rigid connecting members 22, 23, as shown in the drawings, the above-described object or relative rigidity and flexibility can be attained.

In addition, as shown in FIGS. 8A and 8B, four leaf springs 26, which connect each longitudinally opposite end surface portion 24 of the flexible chuck 10 and a correspondingprojection 25 formed at end each opposite end surface of the base plate 14, are provided as a means for restricting the displacement of the flexible chuck 10 in such a manner that the flexible chuck 10 will not be offset or displaced in the horizontal direction or in a direction parallel to a principal plane thereof.

In the case of this embodiment, since the rotational center of the leaf spring 26 is situated at a level or height which is close to that of the surface of the flexible chuck 10, even if the end surface of the flexible chuck 10 may be inclined, the flexible chuck 10 will not be practically offset or displaced in the horizontal direction.

Furthermore, it is apparent that, as shown in FIG. 9A, the means for restricting the displacement of the flexible chuck 10 such as to prevent the chuck 10 from being horizontally or laterally offset or displaced may be constituted by sliding mechanisms 27 disposed between the flexible chuck 10 and the base plate 14 at the peripery of the chuck 10 to allow the flexible chuck 10 to slide vertically relative to the base plate 14.

In addition, it is also apparent that the aforementioned sliding mechanisms 27 may be disposed on the side face of the flexible chuck 10.

Although, in the embodiments, a description has been given mainly on the exposure of a printed circuit board, the apparatus of the present invention may be also constructed for producing, for example, a large area pattern for the liquid crystal display element by exposing the element to irradiation.

As has been described above, in accordance with the present invention, since screws are used for driving mechanisms, a magnitude the vertical displacement of the flexible chuck can be increased substantially greater as compared with a case where piezoelectric elements are used, so that adjustment can be faciliated remarkably. Furthermore, since a method of pulling down a flexible chuck by springs has thus been invented instead of a conventional vacuum suction method, vacuum seals can be dispensed with. In addition, since it is unnecessary to fix an outermost periphery of the flexible chuck for sealing purposes, it has become possible for this peripheral portion to be displaced vertically.

This means that even the peripheral portion of the substrate can be substantially displaced. Thus, a remarkable advantage can be obtained in that a gap between the mask and the printed circuit board can be made completely uniform over the entire area.

What is claimed is:

1. An exposure apparatus comprising:
   a stage;
   a base plate provided on said stage;
   a flexible chuck plate which is capable of sucking under vacuum a substantially entire surface of a substrate to a surface thereof;
   a plurality of vertical displacement generating means including a plurality of feedscrews provided at said base plate with predetermined intervals therebetween, a plurality of rotational actuators for rotatively driving each of said feedscrews, and a plurality of spring members interposed between said chuck plate and said base plate so as to allow a tip of each of said feedscrews to be engaged with a rear surface of said chuck plate;
   restricting means for restricting said chuck plate in such a manner as not to be displaced horizontally relative to said base plate;
   a mask holder for holding a mask;
   means for measuring a level of said mask held by said mask holder; and
   means for measuring a level of the substrate sucked onto said chuck plate,
   whereby each of said rotational actuators of said vertical displacement generating means is driven on the basis of gaps between said mask and said substrate measured by said means for measuring the level of said mask and said means for measuring the level of the substrate so as to subject the substrate to deflection via said flexible chuck plate, thereby producing a uniform gap between said mask and the substrate.

2. An exposure apparatus according to claim 1, wherein said restricting means is constituted by a leaf spring disposed horizontally such as to connect a peripheral portion of said chuck plate and that of said base plate.

3. An exposure apparatus according to claim 1, wherein said restricting means is constituted by a sliding mechanism which vertically slidably supports said base plate at a peripheral portion of said chuck plate.

4. A substrate surface deflecting device comprising:
   a base plate;
   a flexible chuck plate deformable at angular grooves formed regularly in a rear face thereof, the chuck plate being capable of sucking under vacuum a substantially entire surface of a substrate;
   expansion and/or contraction drive elements mounted regularly on the base plate;
   spring members arranged regularly so as to force output ends of the drive elements engaged with the rear face of the chuck plate;
   means for restricting lateral displacement of the chuck plate relative to the base plate; and
   means for controlling the deflection of the surface of the substrate to a desired configuration through the chuck plate by driving the expansion and/or contraction drive elements in response to the condition of the surface of the substrate.

* * * * *